United States Patent
Long et al.

(10) Patent No.: US 6,275,972 B1
(45) Date of Patent: Aug. 14, 2001

(54) METHOD FOR ACCURATE CHANNEL-LENGTH EXTRACTION IN MOSFETS

(75) Inventors: Wei Long, Sunnyvale; Yowjuang W. Liu, San Jose, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/310,806

(22) Filed: May 12, 1999

(51) Int. Cl.[7] .................................................... G06F 17/50
(52) U.S. Cl. .......................................... 716/5; 365/185.27
(58) Field of Search .............................. 364/578; 357/43; 365/185.27; 716/5, 20

(56) References Cited

U.S. PATENT DOCUMENTS

| 5,128,742 | * | 7/1992 | Kao et al. ............................. | 375/43 |
| 5,378,911 | * | 1/1995 | Murakami ............................ | 257/334 |

(List continued on next page.)

OTHER PUBLICATIONS

K. Terada and H. Muta, "A new method to determine effective MOSFET channel length," *Jpn. J. Appl. Phys.*, vol. 18, p. 953, 1979.

J. G. J. Chern, P. Chang, R. F. Motta, and N. Godinho, "A new method to determine MOSFET channel length," in IEEE Electron Device Lett., vol. EDL–1, p. 170, 1980.

J. Y. C. Sun, M. R. Wordeman, and S. E. Laux, "On the accuracy of channel length characterization of LDD MOSFET's," *IEEE Trans. Electron Devices*, vol. ED–33, p. 1556, 1986.

G. J. Hu, C. Chang, and Y. T. Chia, "Gate–voltage–dependent effective channel length and series resistance of LDD MOSFET's," *IEEE Trans Electron Devices*, vol. ED–34, p. 2469, 1987.

D. J. Mountain, "Application of electrical effective channel length and external resistance measurement techniques to a submicrometer CMOS process," *IEEE Trans. Electron Devices*, vol. ED–36, p. 2499, 1989.

J. Ida, S. Ishii, and F. Ichikawa, "Accurate characterization of gate–n overlapped LDD with the new Leff extraction method," in *IEDM Tech. Dig.*, p. 219. 1990.

K. K. Ng and J. R. Brews, "Measuring the effective channel length of MOSFET," *IEEE Circuits and Device Mag.*, vol. 6, p. 33, 1990.

S. E. Laux, "Accuracy of effective channel length/external resistance extraction algorithm for MOSFET's ," *IEEE Trans. Electron Devices*, vol. ED–31, p. 1245, 1984.

K. Terada, "Suppression of measurement errors in effective–MOSFET–channel length extraction," in *Porch. IEEE Int. Con Microelectronic Test Structures*, p. 208, 1992.

S. Hong and K. Lee, "Extraction of Metallurgical effective channel length in LDD MOSFET's," *IEEE Trans. Electron Devices*, vol. ED–42, p. 1461, 1995.

B. J. Sheu and P. K. Ko, "A capacitance method to determine channel lengths for conventional and LDD MOSFET's," *IEEE Trans. Electron Lett.*, vol. EDL–5, No. 11, p. 491, 1984.

S. W. Lee, "A capacitance based method for experimental determination of metallurgical channel length of submicron LDD MOSFET's," *IEEE Trans. Electron Devices*, vol. ED–41, p. 404, 1994.

(List continued on next page.)

Primary Examiner—David Nelms
Assistant Examiner—Thong Le
(74) Attorney, Agent, or Firm—Foley & Lardner

(57) ABSTRACT

A method for extracting a channel length between a source and a drain in a substrate of a transistor is disclosed herein. The method includes forward biasing the source with respect to the substrate to inject a charge into the substrate, collecting the charge at the drain, and calculating the channel length from the charge collected at the drain.

20 Claims, 7 Drawing Sheets

U.S. PATENT DOCUMENTS

| | | | |
|---|---|---|---|
| 5,481,485 | | 1/1996 | Takeuchi ............................... 364/578 |
| 5,606,518 | * | 2/1997 | Fang et al. ............................ 364/578 |
| 5,648,920 | | 7/1997 | Duvvury et al. ...................... 364/578 |
| 5,657,271 | * | 8/1997 | Mori ................................. 365/185.27 |

OTHER PUBLICATIONS

H. H. Li and C. Y. Wu, "A novel extraction technique for the effective channel length of MOSFET devices," *IEEE Trans. Electron Devices*, vol. ED–42, p. 856, 1995.

* cited by examiner

METHOD FOR ACCURATE CHANNEL-LENGTH EXTRACTION IN MOSFETS

FIELD OF THE INVENTION

The present invention is related to integrated circuit (IC) devices. More particularly, the present invention relates to a method for accurate channel-length extraction or measurement in metal oxide semiconductor field effect transistors (MOSFETs).

BACKGROUND OF THE INVENTION

Integrated circuits (ICs) include a multitude of transistors formed on a semiconductor substrate. Transistors, such as, metal oxide semiconductor field effect transistors (MOSFETs), are generally built on the top surface of a bulk substrate. The substrate is doped to form impurity diffusion layers (i.e. source and drain regions). A conductive layer is situated between the source and drain regions; the conductive layer operates as a gate for the transistor. The gate controls current in a channel between the source and the drain regions.

Accurate determination of the effective channel length becomes ever more important for device miniaturization, optimization, and modeling. Conventional efforts to find a simple and accurate method to determine or extract the channel length of a MOSFET device are based upon measurements of resistance, capacitance, and interface states. However, in order to use capacitance and interface related methods, higher resolution equipment is required to measure gate capacitance in the range of femto ($10_{-15}$) farads and detect substrate current down to the level of pico ($10_{-12}$) amperes, especially as gate lengths approach distances of less than 70 nm. As such, capacitance and interface related methods are not recommended for routine monitoring in a mass production environment.

Compared to capacitance and interface related methods, channel length extraction algorithms based on resistance are much simpler. Resistance related methods such as "paired $V_G$ (gate voltage)" and "shift and ratio" are used conventionally in practical applications. Nevertheless, the charge sharing effect by the source/drain depletion, gate bias dependence of the source/drain resistance, and the non-linearity problem inherent to proper calculation of $V_T$ (threshold voltage) make accurate determination of deep submicrometer channel length difficult using resistance related methods.

Thus, there is a need for a method for accurate channel-length extraction. Further, there is a need for a method of accurate channel-length extraction for use in mass IC fabrication processes. Even further, there is a need for a simple and accurate measurement of transistor channel length.

SUMMARY OF THE INVENTION

One embodiment of the invention relates to a method for extracting a channel length between a source and a drain in a substrate of a transistor. The method includes forward biasing the source with respect to the substrate to inject a charge into the substrate, collecting the charge at the drain, and calculating the channel length from the charge collected at the drain.

Another embodiment of the invention relates to an apparatus for extracting a channel length between a source and a drain in a substrate of a transistor. The apparatus includes means for forward biasing the source with respect to the substrate to inject a charge into the substrate, means for collecting the charge at the drain, and means for calculating the channel length from the charge collected at the drain.

Another embodiment of the invention relates to a system for extracting a channel length between a source region and a drain region in a substrate of a transistor. The system includes a voltage source, a current collector, and a processing unit. The voltage source is coupled to the source region and injects a charge into the substrate. The current collector is coupled to the drain region and collects the charge from the substrate received by the drain region. The processing unit determines the channel length from the charge collected by the current collector.

BRIEF DESCRIPTION OF THE DRAWINGS

The preferred embodiments of the invention will become more fully understood from the following detailed description, taken in conjunction with the accompanying drawings, wherein like reference numerals denote like elements, in which.

DETAILED DESCRIPTION OF THE PREFERRED EMBODIMENTS

Figure 1:
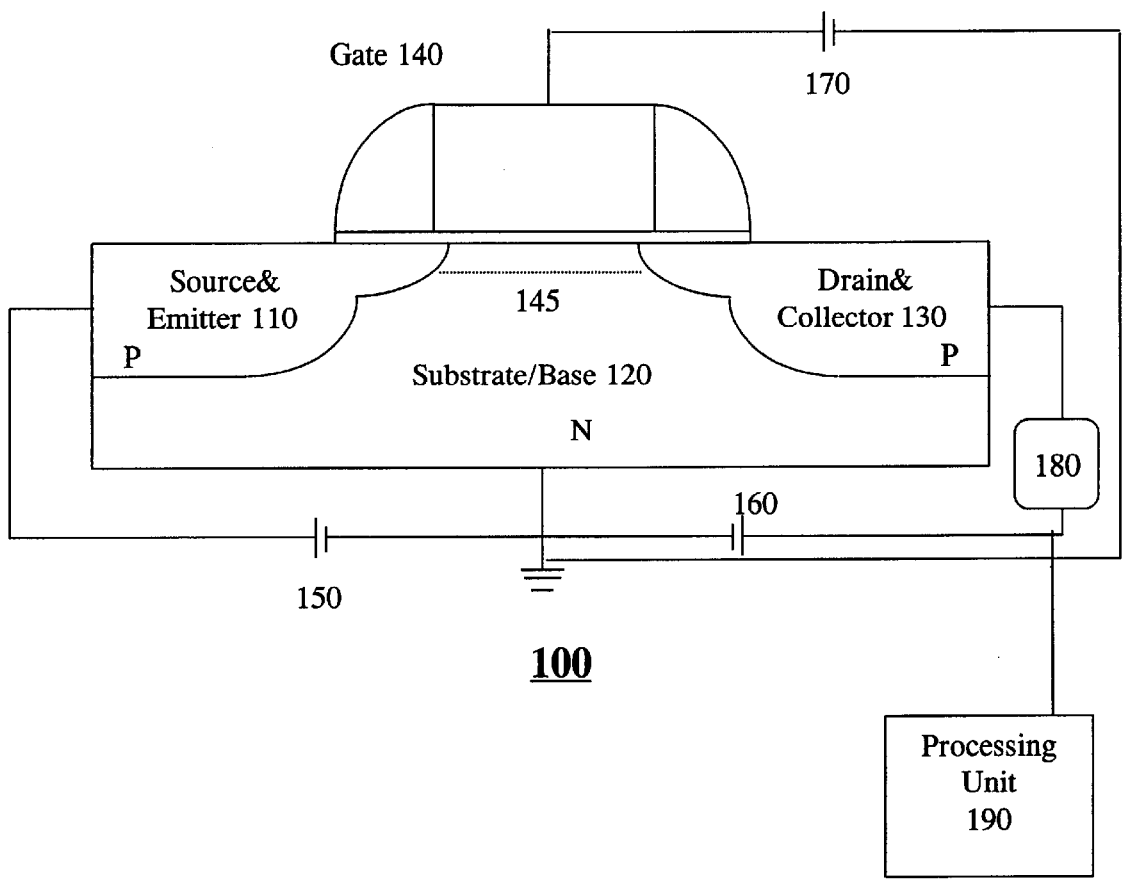
FIG. 1 is a general diagram illustrating a MOSFET connected in a common-base configuration for effective channel length measurement in accordance with an exemplary embodiment of the present invention.

FIG. 1 is a general block diagram illustrating a MOSFET 100 connected in a common-base configuration. MOSFET 100 includes a source/emitter 110, a substrate/base 120, a drain/collector 130, and a gate 140. In the exemplary embodiment, MOSFET 100 is a PNP (p-channel) transistor. As such, source/emitter 110 and drain/collector 130 are p-type doped semiconductors. P-type doped semiconductors are materials in which carriers of positively charged holes predominate. Substrate/base 120 is a n-type doped semiconductor. N-type doped semiconductors are materials in which carriers of negatively charged electrons predominate. MOSFET 100 is alternatively a NPN transistor in which source/emitter 110 and drain/collector 130 are n-type and substrate/base 120 is p-type.

A channel 145 extends between source/emitter 110 and drain/collector 130 in substrate/base 120 and under gate 140. If a voltage is applied between gate 140 and source/emitter 110, and substrate/base 120 is biased with respect to source/emitter 110, a current flows through channel 145. The threshold voltage ($V_T$) is the voltage between gate 140 and source/emitter 110 at which a sufficient number of mobile charges accumulate in channel 145 to form a conducting channel. Where source/emitter 110 and drain/collector 130 are p-type, channel 145 is a p-channel. In such an embodiment, channel 145 can be called an inversion layer, because p-type mobile charges are formed in n-type substrate/base 120.

MOSFET 100 is configured for measuring the effective length ($L_{eff}$) of channel 145 (i.e., the left-to-right width of channel 145, as shown in FIG. 1) as follows. In the method of measuring $L_{eff}$, the junction between source/emitter 110 and substrate/base 120 is forward biased by a voltage source 150. The junction between source/base 120 and drain/collector 130 is reversed biased by a voltage source 160. Alternatively, the potential between source/base 120 and drain/collector 130 can be zero volts.

Gate 140 is biased in a sub-threshold region by a voltage source 170. Although gate 140 is biased at a sub-threshold level and a conducting channel is not created per se, charge injected from substrate/emitter 110 to substrate/base 120 is substantially collected at drain/collector 130.

A current collector 180 is attached to drain/collector 130 for collecting the charge received by drain/collector 130 from substrate/base 120. A processing unit 190 determines the length of channel 145 from the charge collected by current collector 180. Current collector 180 can be an amp meter or any device for measuring the current collected at drain/collector 130. Processing unit 190 is a microprocessor, a logic device, a computer, or any other device for processing data. Current collector 180 and processing unit 190 are alternatively integrated into one unit.

Figure 2:
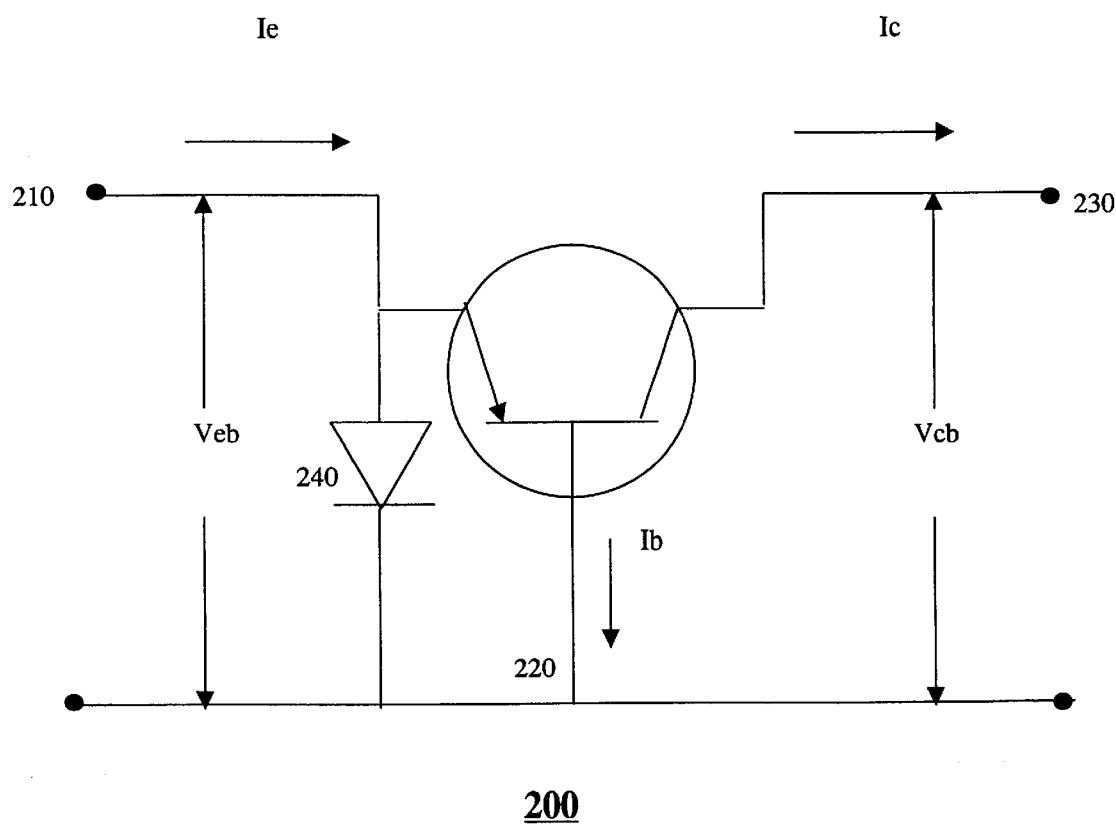
FIG. 2 is a circuit diagram illustrating an equivalent circuit for a parasitic PNP bi-polar transistor in accordance with an embodiment of the present invention.

When MOSFET 100 is configured as shown in FIG. 1, MOSFET 100 can be represented as a common-base configuration of a bipolar transistor 200 (FIG. 2) with a p-n junction diode 240 connected between an emitter 210 and a base 220. FIG. 2 is a circuit diagram of an equivalent circuit for parasitic PNP bipolar transistor 200. Transistor 200 includes emitter 210, base 220, and a collector 230. As shown in FIG. 2, an emitter current ($I_e$) into transistor 200 results in a base current ($I_b$) and a collector current ($I_c$). Emitter 210 corresponds to source/emitter 110, base 220 corresponds to substrate/base 120, and a collector 230 corresponds to drain/collector 130.

With reference to FIGS. 1 and 2, the forward biasing of the junction between source/emitter 110 and substrate/base 120 injects a charge into substrate/base 120. The injected charge is collected by drain/collector 130 from substrate/base 120 because the junction between drain/collector 130 and substrate/base 120 is reversed biased or zero biased. Therefore, the injected current travels across the junction between source/emitter 110 and substrate/base 120 (e.g., through diode 240 (FIG. 2)).

Emitter current $l_e$ (FIG. 2) corresponds to the injected charge collected by substrate/base 14 during the forward biasing of the junction between source/emitter 12 and substrate/base 14 (FIG. 1). Collector current ($I_c$) (FIG. 2) corresponds to the collected charge at drain/collector 130 (FIG. 1). Bipolar theory provides that collector current $I_c$ is proportional to $1/L_{eff}$, where $L_{eff}$ is the effective channel length. In other words, current from emitter 210 to collector 230 is a linear function of $1/L_{eff}$ for $L_{eff}<\sim 10 \mu m$. The $I_c$ and $L_{eff}$ relationship can be expressed:

$$I_c = \frac{f_1((V_{eb} - V_{bi}), V_{gb})}{L_{eff}} + f_2((V_{eb} - V_{bi}), V_{gb})$$

where $V_{eb}$ is emitter base bias, $V_{bi}$ is built in potential, $V_{gb}$ is gate to substrate voltage, and $f_1$ and $f_2$ are constant with respect to $I_c$ and $L_{eff}$.

Collector current $I_c$ is collected from drain/collector 130 by current collector 180. Processing unit 190 determines channel length $L_{eff}$ from collector current $I_c$ in the following manner. Processing unit 190 uses the collector current $I_c$ from current collector 180 to correlate $I_c$ with the lithographic length, or mask length, of channel 145 ($L_{draw}$), a known value for a particular MOSFET 100 in the manufacturing process. Processing unit 190 correlates the values of $I_c$ and $L_{draw}$ using a graph, a lookup table, a linear equation, or any other representation of a two variable relationship.

Figure 3:
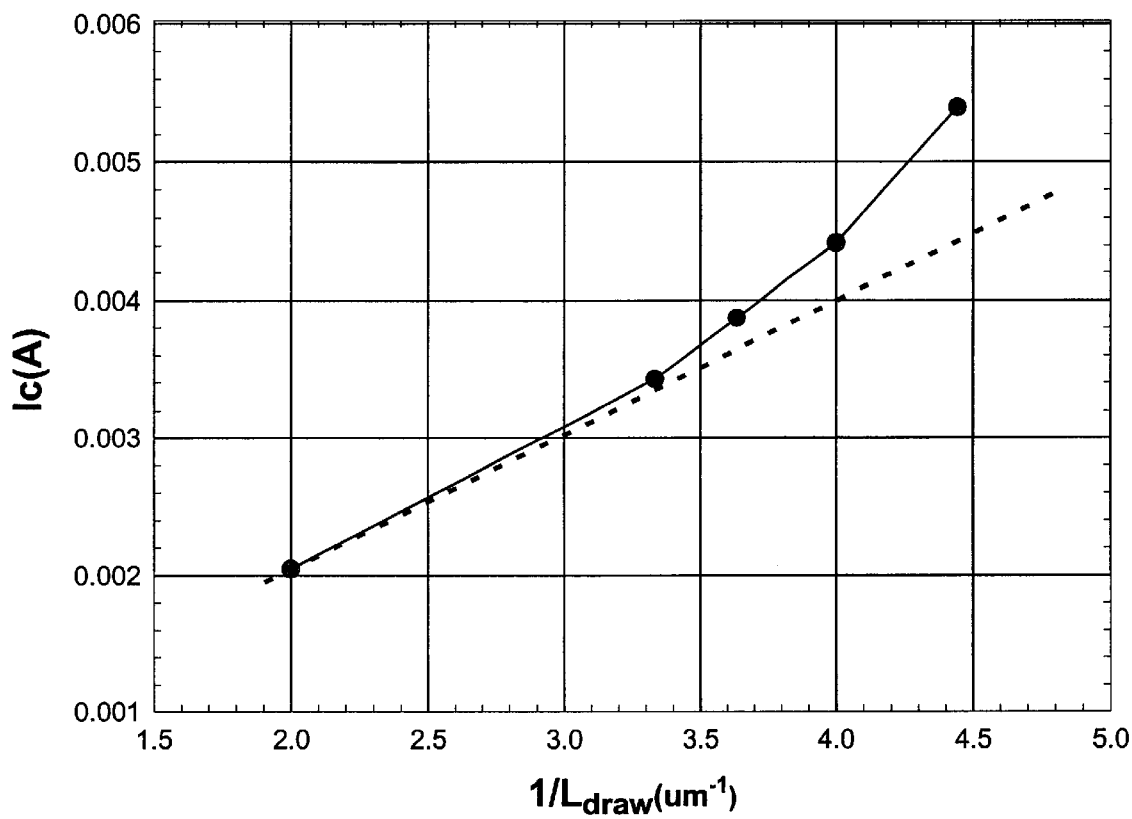
FIG. 3 is a graph illustrating measured collector current $I_C$ as a function of $1/L_{draw}$ for NMOS transistors.
Figure 4:
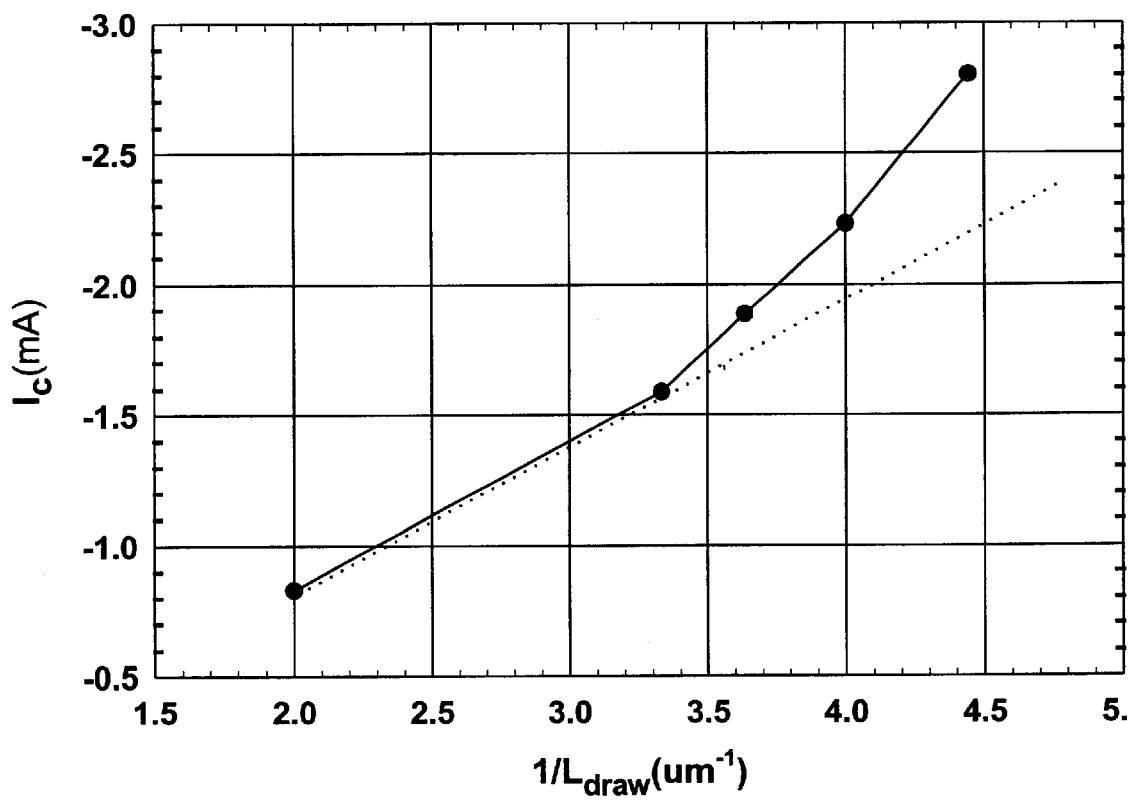
FIG. 4 is a graph illustrating measured collector current $I_C$ as a function of $1/L_{draw}$ for PMOS transistors.

FIGS. 3 and 4 are exemplary graphs illustrating measurement results of $I_c$ vs. $1/L_{draw}$ for N- and P-channels with a set of varied channel lengths. The varied channel lengths correspond to different mask channels in close proximity to each other on the same wafer. Channels in close proximity have substantially the same variation $\Delta L$. FIG. 3 is a graph of measured collector current $I_c$ as a function of $1/L_{draw}$ for a N-MOS transistor. FIG. 4 is a graph of measured collector current $I_c$ as a function of $1/L_{draw}$ for a P-MOS transistor.

The lithographic length, or mask length, of channel 145 ($L_{draw}$) is related to the effective length $L_{eff}$ of channel 145 by some variation $\Delta L$ in the manufacturing process of MOSFET 100 ($L_{eff}=L_{draw}-\Delta L$). Thus, using $L_{draw}$ to determine $L_{eff}$ requires an estimation of the variation $\Delta L$. In both graphs (FIGS. 3 and 4), a linear relationship between $L_{draw}$ and $I_c$ is observed for longer channel lengths with some negligible variation because larger values of $L_{draw}$ (or smaller values of $1/L_{draw}$) have minimal effect by $\Delta L$. For short channel devices (i.e., smaller values of $L_{draw}$ or larger values of $1/L_{draw}$), the $I_c$ vs. $L_{draw}$ curve moves away from the linear trend line, indicating an increasing contribution of $\Delta L$.

Figure 5:
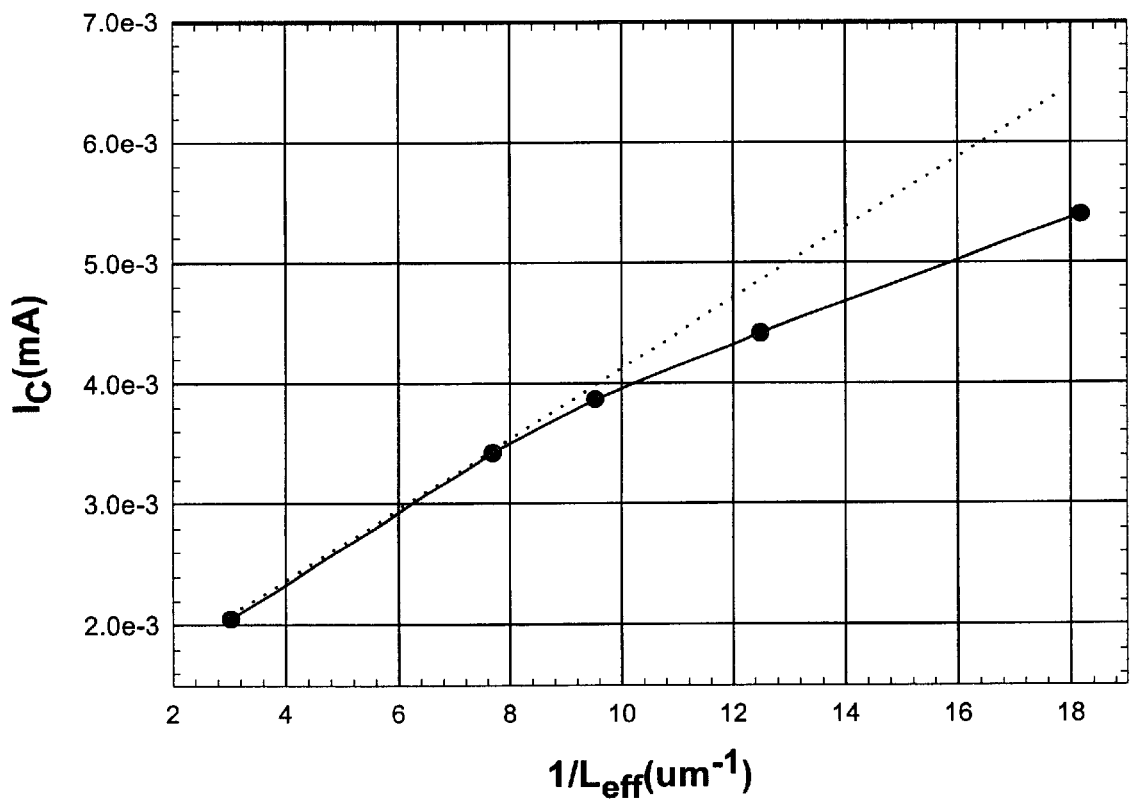
FIG. 5 is a graph illustrating calculated $I_C$ versus $1/L_{EFF}$ or $1(L_{draw}-\Delta L)$ for PMOS transistors.

Determination of $L_{eff}$ requires a determination of the optimal value of $\Delta L$, or the $\Delta L$ value which results in a linear relationship between $I_c$ and $1/L_{draw}$. The optimum value of $\Delta L$ also results in a minimum standard error of channel length measurement. As shown in FIG. 4, if the $\Delta L$ variation is zero or small, the slope $dI_c/d(1/L_{draw})$ is a monotonically increasing function of $1/L_{draw}$. As shown in FIG. 5, if the $\Delta L$ variation is too large (e.g., $\Delta L=0.16 \mu m$), the slope monotonically decreases with $1/L_{draw}$.

Figure 6:
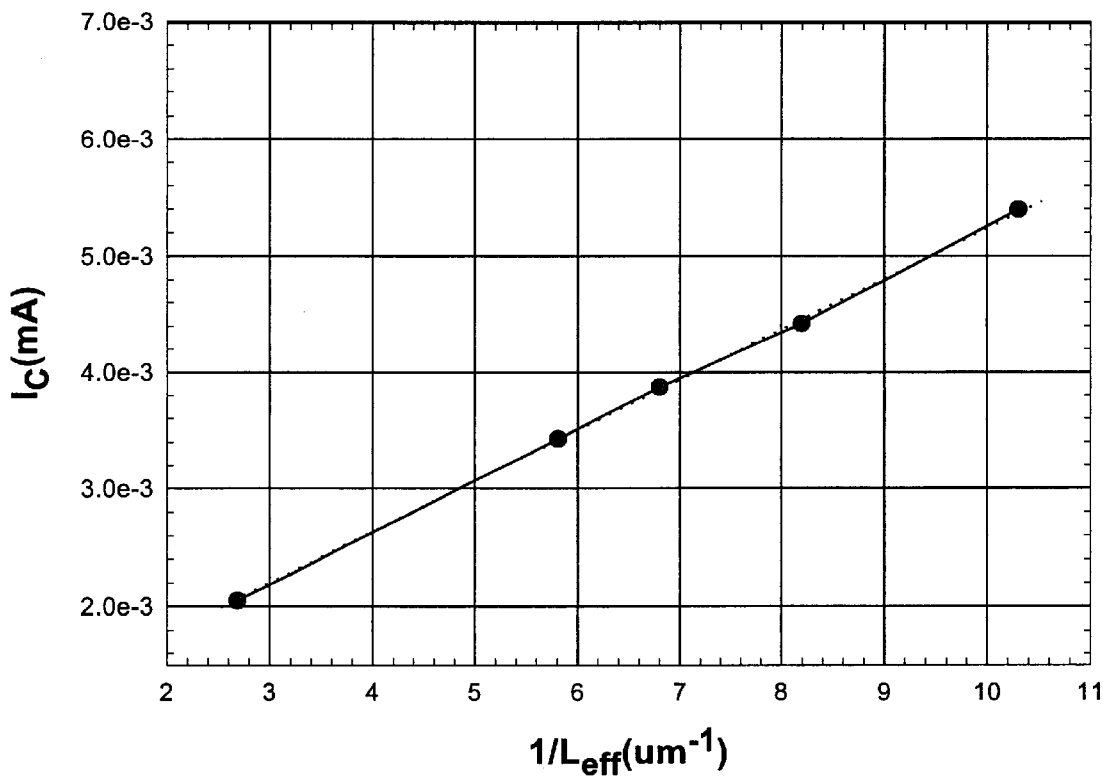
FIG. 6 is a graph illustrating calculated $I_C$ versus $1/L_{EFF}$ or $1/(L_{draw}-\Delta L)$ for PMOS transistors.
Figure 7:
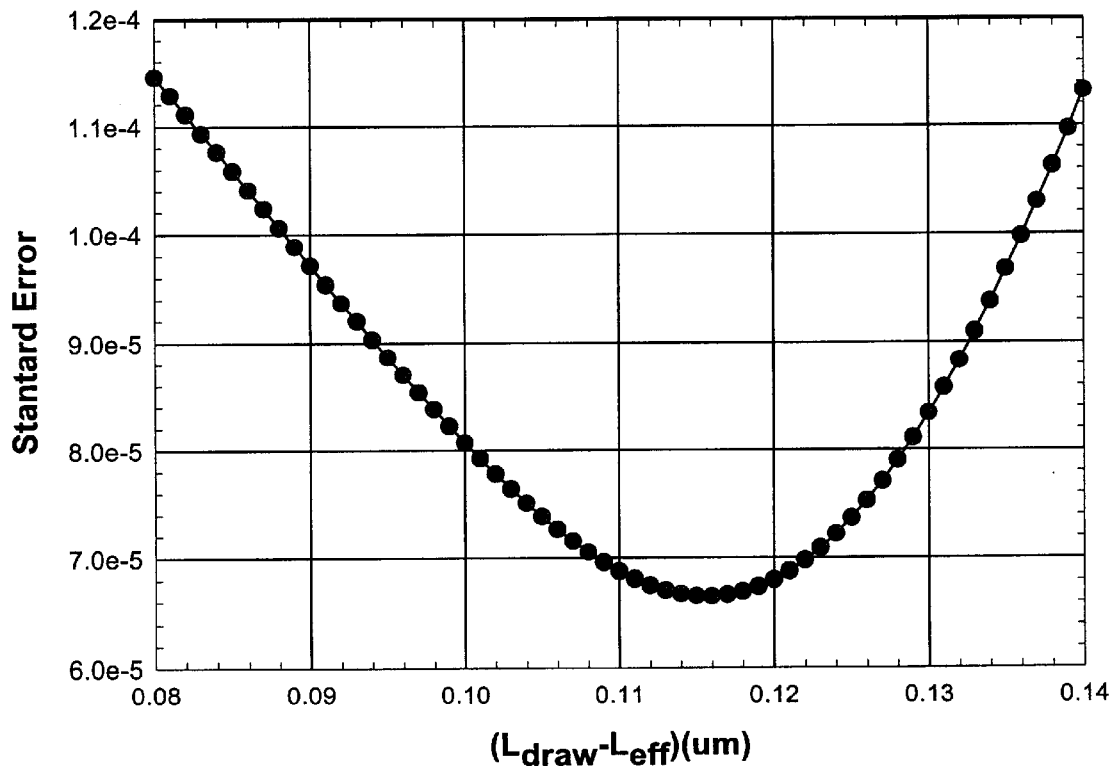
FIG. 7 is a graph illustrating calculated standard error versus $\Delta L$ for PMOS transistors.

Processing unit 190 (FIG. 1) performs a least square linear regression to determine the best linear square "fit" or the optimal value of $\Delta L$ for measured values of $I_c$ for different mask channel lengths ($L_{draw}$) in nearby locations on a silicon wafer. While variations may exist in the actual mask lengths, such variations are negligibly small. Only when $\Delta L$ is optimized among MOSFETs 100 located in close proximity to each other on a silicon wafer, does the slope $dI_c/d(1/L_{eff})$ become nearly independent of $1/L_{eff}$. FIG. 6 is a graph illustrating the resulting straight line or constant slope when $\Delta L$ is optimized (e.g., $\Delta L=0.116 \mu m$). FIG. 7 is a graph illustrating a standard error $\sigma$ vs. $\Delta L$ curve. The graph exhibits a sharp minimum at the point of optimum $\Delta L$ for the linear correlation. Standard error (of channel length measurement) $\sigma$ is calculated as a function of the selected range of $\Delta L$.

Thus, after determination of optimal $\Delta L$ for a wafer of multiple MOSFETs 100 using least square linear regression techniques, processing unit 190 determines effective channel length of individual MOSFETs 100 by measuring the collector current $I_c$ and determining the corresponding channel length using $L_{eff}=L_{draw}-\Delta L$. Processing unit 190 performs the channel length determination using a graph, a lookup table, a linear equation, or any other representation of a two variable relationship.

The $I_c$ and $L_{eff}$ relationship provides advantages to channel length determination in accordance with the present invention, as compared to conventional methods of channel length extraction. Unlike the conventional resistance method, threshold voltage ($V_T$) is not involved. Gate 140 is biased in the sub-threshold region, rather than in the threshold region, as done in the conventional resistance method for determining channel length.

Moreover, the emitter-base voltage $V_{eb}$ (e.g., source 150) can extremely forward biased to inject excessive minority carrier to base 120. Injecting excessive minority carrier to substrate/base 120 minimizes charge sharing effect and makes the collector current Ic less sensitive to the doping variation in the channel.

Ideally, the extracted channel length should equal the mask channel length ($L_{draw}$), which is a physical quantity independent of channel doping profile, external resistance, and biases. It is important in the method for determining channel length, as discussed with reference to FIGS. 1–7, that a proper $L_{draw}$ range is selected. Preferably, the range of $L_{draw}$ is from nominal to about 1 µm.

In general, the emitter (source/drain extension) resistance is negligible compared to the base (channel) resistance, which is quite different in the case of the resistance method. However, especially for N-channel devices, the contribution of extension resistance is negligible because of relatively high doping concentration in the extensions.

The method for determining channel length described with reference to FIGS. 1–7 overcomes problems in the widely used conventional resistance method. First, the problem associated with the determination of threshold voltage is removed by measuring the device in the bipolar operating regime or MOSFET sub-threshold regime. Secondly, the charge sharing effect is minimized by forward biasing the junction with a small gate drive.

Furthermore, the method is advantageously simple and very suitable for routing parameter monitoring in the mass production environment. For MOSFETs 100 closely placed in a common wafer during the mass production process, device parameters such as area, thickness, and doping of source/emitter 110 and drain/collector 130 are presumably substantially identical. The distance between source/emitter 110 and drain/collector 130 may not be identical. Thus, calculation of the length of channel 145 is necessary.

While the embodiments illustrated in the FIGURES and described above are presently preferred, it should be understood that these embodiments are offered by way of example only. Other embodiments may include, for example, different techniques for injecting and collecting a charge from the transistor. The invention is not limited to a particular embodiment, but extends to various modifications, combinations, and permutations that nevertheless fall within the scope and spirit of the appended claims.

We claim:

1. A method for extracting a channel length between a source and a drain in a substrate of a transistor, the method comprising:

forward biasing the source with respect to the substrate to inject a charge into the substrate;

collecting the charge at the drain; and calculating the channel length from the charge collected at the drain.

2. The method of claim 1, further comprising reverse biasing the drain with respect to the substrate.

3. The method of claim 1, further comprising determining an optimum channel length variation due to manufacturing the transistor.

4. The method of claim 3, wherein determining an optimum channel length variation includes using least square linear regression.

5. The method of claim 1, further comprising biasing a gate in a subthreshold region.

6. The method of claim 1, wherein forward biasing the source with respect to the substrate injects an excessive minority carrier wherein charge sharing is minimized.

7. An apparatus for extracting a channel length between a source and a drain in a substrate of a transistor, the means comprising:

means for forward biasing the source with respect to the substrate to inject a charge into the substrate;

means for collecting the charge at the drain; and means for calculating the channel length from the charge collected at the drain.

8. The apparatus of claim 7, further comprising means for reverse biasing the drain with respect to the substrate.

9. The apparatus of claim 7, wherein the means for calculating the channel length is done without a measurement of threshold voltage.

10. The apparatus of claim 7, further comprising means for biasing a gate in a subthreshold region.

11. The apparatus for claim 7, wherein the means for forward biasing the source with respect to the substrate injects an excessive minority carrier as to minimize charge sharing.

12. A system for extracting a channel length between a source region and a drain region in a substrate of a transistor, the system comprising:

a voltage source coupled to the source region, the voltage source injecting a charge into the substrate;

a current collector coupled to the drain region, the current collector collecting the charge from the substrate received by the drain region; and a processing unit, the processing unit determining the channel length from the charge collected by the current collector.

13. The system of claim 12, further comprising a voltage source coupled to the drain region, the voltage source collecting the charge and the substrate at the drain region.

14. The system of claim 12, further comprising a voltage source coupled to a gate region, the gate region being intermediate to the source region and the drain region, the voltage source injecting a charge into the substrate.

15. The system of claim 14, wherein the voltage source operates at a subthreshold voltage level.

16. The system of claim 12, wherein the processing unit determines the channel length by determining an optimum channel length variation due to manufacturing the transistor.

17. The system of claim 16, wherein the processing unit uses least square linear regression in determining an optimum channel length variation.

18. The system of claim 12, wherein the processing unit determines the channel length for a plurality of transistors in a mass production environment.

19. A system for extracting a channel length between a source region and a drain region in a substrate of a transistor, the system comprising:

a voltage source coupled to the source region, the voltage source injecting a charge into the substrate;

a current collector coupled to the drain region, the current collector collecting the charge from the substrate received by the drain region; and a processing unit, the processing unit determining the channel length from the charge collected by the current collector, wherein the processing unit determines channel length based on the equation:

$$I_c = \frac{f_1((V_{eb} - V_{bi}), V_{gb})}{L_{\textit{eff}}} + f_2((V_{eb} - V_{bi}), V_{gb})$$

where $V_{eb}$ is an emitter base bias, $V_{bi}$ is a built in potential, $V_{gb}$ is gate to substrate voltage, and $f_1$ and $f_2$ are constant with respect to $I_c$ and $L_{\textit{eff}}$.

20. The system of claim 12, wherein the voltage source injects an excessive charge into the substrate.

* * * * *